United States Patent
Brown et al.

(10) Patent No.: US 9,150,750 B2
(45) Date of Patent: Oct. 6, 2015

(54) CURABLE ACRYLATE BASED PRINTING MEDIUM

(71) Applicant: Ferro Corporation, Mayfield Heights, OH (US)

(72) Inventors: Terry J. Brown, Pittsburgh, PA (US); Kimberly Stewart, Alexandria, VA (US); Thirumalai Duraisamy, Pittsburgh, PA (US)

(73) Assignee: Ferro Corporation, Cleveland, OH (US)

( * ) Notice: Subject to any disclaimer, the term of this patent is extended or adjusted under 35 U.S.C. 154(b) by 0 days.

(21) Appl. No.: 14/333,559

(22) Filed: Jul. 17, 2014

(65) Prior Publication Data

US 2014/0329356 A1 Nov. 6, 2014

Related U.S. Application Data

(62) Division of application No. 12/858,623, filed on Aug. 18, 2010, now Pat. No. 8,816,012.

(51) Int. Cl.

| | |
|---|---|
| *C09D 133/10* | (2006.01) |
| *C08F 290/08* | (2006.01) |
| *C08F 283/00* | (2006.01) |
| *C03C 17/04* | (2006.01) |
| *H01L 31/0224* | (2006.01) |
| *C09D 11/101* | (2014.01) |
| *C03C 17/32* | (2006.01) |
| *H01L 31/18* | (2006.01) |
| *C08F 222/10* | (2006.01) |
| *C08F 220/30* | (2006.01) |

(52) U.S. Cl.

CPC .............. *C09D 133/10* (2013.01); *C03C 17/04* (2013.01); *C03C 17/32* (2013.01); *C08F 283/008* (2013.01); *C08F 290/08* (2013.01); *C09D 11/101* (2013.01); *H01L 31/022425* (2013.01); *H01L 31/18* (2013.01); *C03C 2217/72* (2013.01); *C08F 222/1006* (2013.01); *C08F 2220/301* (2013.01); *Y02E 10/50* (2013.01)

(58) Field of Classification Search
None
See application file for complete search history.

(56) References Cited

U.S. PATENT DOCUMENTS

| | | |
|---|---|---|
| 3,994,764 A | 11/1976 | Wolinski |
| 4,012,542 A | 3/1977 | Oswitch et al. |
| 4,649,062 A | 3/1987 | Kosiorek et al. |
| 4,677,179 A | 6/1987 | Hannemann |
| 5,178,685 A | 1/1993 | Borenstein et al. |
| 5,476,894 A | 12/1995 | Huber |
| 5,549,929 A | 8/1996 | Scheibelhoffer et al. |
| 5,643,657 A | 7/1997 | Dueber et al. |
| 5,647,901 A | 7/1997 | Brown |
| 5,855,820 A | 1/1999 | Chan et al. |
| 6,037,014 A * | 3/2000 | Edgington ............... 427/544 |
| 6,077,563 A | 6/2000 | Kapp et al. |
| 6,140,386 A | 10/2000 | Vanderhoff et al. |
| 6,183,871 B1 | 2/2001 | Lee et al. |
| 6,617,371 B2 | 9/2003 | Ha |
| 7,365,105 B2 | 4/2008 | Kiefer-Liptak |
| 7,547,369 B2 | 6/2009 | Khadilkar et al. |
| 8,816,012 B2 | 8/2014 | Brown et al. |
| 2006/0160918 A1 | 7/2006 | Fujita et al. |
| 2006/0260734 A1 | 11/2006 | Brown et al. |
| 2007/0281136 A1 | 12/2007 | Hampden-Smith et al. |
| 2008/0226863 A1 | 9/2008 | Prunchak et al. |
| 2009/0035535 A1 | 2/2009 | Wachi et al. |
| 2010/0004376 A1 | 1/2010 | Killilea et al. |
| 2010/0071837 A1 | 3/2010 | Kapp et al. |
| 2010/0113685 A1 | 5/2010 | Coward et al. |

FOREIGN PATENT DOCUMENTS

JP 58-174477 A 10/1983

OTHER PUBLICATIONS http://infohouse.p2ric.org/ref/17/16643.pdf, Apr. 1996.*
http://www.chemicalbook.com/ChemicalProductProperty_EN_CB4852296.htm, May 2010.*
International Search Report for corresponding PCT/US2011/046527 mailed Dec. 16, 2011, two pages.
http://infohouse.p2ric.org/ref/17/16643.pdf, Apr. 1996.
http://www.chemicalbook.com/ChemicalProductProperty_EN_CB4852296.htm, May 20, 2010.
English translation of JP 58-174477 published Oct. 13, 1983, 17 pages.
http://en.wikipedia.org/wiki/Dimethylformamide.

* cited by examiner

*Primary Examiner* — Satya Sastri

(74) *Attorney, Agent, or Firm* — Rankin, Hill & Clark LLP

(57) ABSTRACT

An acrylate-based curable printing medium is disclosed. Acrylates, in the form of monomers, dimers, trimers and oligomers, as well as resins, form an interpenetrating polymer network by crosslinking, which is effected by heat, and optionally peroxide curing agents. Formulations can be tailored to achieve desired properties of the cured polymer including film hardness, burnout properties, and adhesion to glass. Such properties are adjusted by manipulating the relative proportions of the acrylic monomers, oligomers and resins that are used as a ceramic medium or vehicle.

15 Claims, No Drawings

CURABLE ACRYLATE BASED PRINTING MEDIUM

BACKGROUND OF THE INVENTION

1. Field of Invention

The present invention relates to organic (acrylate based) printing mediums that can be cured using free-radical initiators without the use of low boiling solvents, and which accordingly release low levels of volatile organic compounds.

2. Description of Related Art

Conventional mediums for screen-printing and roll-coating useful for ceramic applications include solvents and organic binder resins. Some may require ultraviolet light to cure. Solvent-based systems accordingly exude high concentrations of volatile organic compounds (VOCs), in the range of 300-400 grams per liter or greater. Ultraviolet curable coatings are limited to a film thickness of about 30 microns and require ultraviolet lamps to cure. The curable acrylate-based printing medium of the invention overcomes these drawbacks, both with respect to VOC release and film thickness.

BRIEF SUMMARY OF THE INVENTION

The present invention provides an acrylic based curable printing medium that can be cured without the use of special ultraviolet curing equipment. The mediums of the invention can be cured with heat alone, such as convection heating or infrared heating. The medium can be printed or otherwise applied to far greater thicknesses than UV curable mediums and cured quickly with the release of extremely low amounts of volatile organic chemicals (VOC). Curing agents such as photoinitiators are not necessary and are preferably excluded.

Acrylates, in the form of monomers, dimers, trimers, oligomers, and resins, form an interpenetrating polymer network by crosslinking, which is effected by heat and the optional use of curing agents such as peroxides. Formulations can be tailored to achieve desired properties of the cured polymer including film hardness, burnout properties, and adhesion to glass or other substrates. Such properties are adjusted by manipulating the relative proportions of the acrylic monomers, oligomers and resins that are used to form the medium of the invention.

Broadly, the inventive composition is a printable medium or vehicle that includes unsaturated carbon-carbon bonds, which is cured via free radical polymerization that is initiated by heat and optional temperature-sensitive initiators. Reducing agents may also be used in addition to the foregoing. Ultraviolet energy is not required, and indeed, will not work to cure the systems of the invention. Absent photoinitiators, the use of ultraviolet light will not be sufficient to cure the systems described herein.

The medium of the invention includes various combinations of functional acrylate monomers (monofunctional through pentafunctional), acrylic oligomers and acrylic resins. Metal driers are optionally useful. Free-radical scavengers can be added to the formulation in order to ensure a long shelf life, i.e., in-can stabilizers.

In particular, an embodiment of the invention is a low VOC, heat-curable medium comprising: (a) 20-95 wt %, preferably 30-80 wt %, more preferably 35-70 wt %, of a functional acrylate monomer having at least one functionality, (b) 0.1-20 wt %, preferably 1-18 wt %, more preferably 2-15 wt % of a solvent having a boiling point of at least 150° C., preferably at least 175° C., more preferably at least 200° C. at STP, (c) up to 20 wt %, preferably 0.1-18 wt %, more preferably 1-15 wt % of an acrylic resin, and (d) up to 15 wt %, preferably 0.5-12 wt % more preferably 1-10 wt % of an oligomer including at least one of a polyester residue and a urethane residue.

Another embodiment of the invention is a medium such as in the preceding paragraph, wherein the acrylic resin is present in an amount of 0.1-20 wt % of the medium, and wherein the acrylic resin has a general formula selected from the group consisting of (a) $R^1$ C(O)OR, (b) $Ar^1$ C(O)OR, (c) $Ar^1$ $R^1$ C(O)OR, (d) $R^1$ $Ar^1$ C(O)OR, and combinations thereof, wherein $Ar^1$ is an aromatic residue having up to 30 carbons, that is optionally substituted with at least one substituent selected from the group consisting of —OH, $C_1$-$C_4$-alkoxy, $C_1$-$C_4$-alkoxycarbonyl or carbonyl, wherein $R^1$ is an aliphatic residue having up to 15 carbons, that is optionally substituted with at least one substituent selected from the group consisting of —OH, $C_1$-$C_4$-alkoxy, $C_1$-$C_4$-alkoxycarbonyl or carbonyl, and wherein either or both of $Ar^1$ or $R^1$ may be $C_5$-$C_{10}$-cycloalkyl which is optionally mono- or polysubstituted by $C_1$-$C_4$-alkyl, —OH, $C_1$-$C_4$-alkoxy, $C_1$-$C_4$-alkoxycarbonyl or carbonyl, and combinations thereof.

Yet another embodiment of the invention is a method of forming a decorated glass structure comprising: (a) applying to a first glass substrate an enamel paste composition comprising, (i) a glass component, and (ii) a low VOC, heat-curable medium comprising: (1) 20-95 wt % of a functional acrylate monomer having at least one functionality, (2) 0.1-20 wt % of a solvent having a boiling point above 200° C. at STP, (3) up to 20 wt % of an acrylic resin, and (4) up to 15 wt % of an oligomer including at least one of a polyester residue and a urethane residue, (b) curing the medium by exposure to heat, heating the medium to a maximum of 204° C., thereby firmly adhering the medium to the first substrate, (c) stacking a second glass substrate with the first glass substrate wherein the cured paste-medium lies between the first and second glass substrates, and (d) subjecting the stacked glass substrates to a firing operation upon completion of which, (i) only the first glass substrate bears a sintered enamel composition, (ii) the medium burns out substantially completely, and (iii) the glass substrates do not stick to one another.

Yet another embodiment of the invention is a method of making a solar cell contact comprising: (a) applying a paste to a silicon wafer, wherein the paste comprises (i) a metal component including at least one of silver and aluminum, (ii) a glass component including at least one glass frit, and (iii) a low VOC, heat-curable medium comprising: (1) 20-95 wt % of a functional acrylate monomer having at least one functionality, (2) 0.1-20 wt % of a solvent having a boiling point above 200° C. at STP, (3) up to 20 wt % of an acrylic resin, and (4) up to 15 wt % of an oligomer including at least one of a polyester residue and a urethane residue, and (b) firing the paste to form the contact.

An embodiment of the invention is a method of forming a decorated glass structure comprising: (a) applying to a first glass substrate an enamel composition comprising, prior to firing: (i) a glass component and (ii) an acrylate based medium, (b) curing the medium, (c) stacking a second glass substrate with the first glass substrate wherein the glass component and medium lie between the first and second glass substrates, and (d) firing the glass substrates wherein (i) the glass component fuses to the first glass substrate, (ii) the medium completely burns out, and (iii) the glass substrates do not stick to one another.

DETAILED DESCRIPTION OF THE INVENTION

An embodiment of the invention is a low VOC, heat-curable medium comprising: (a) 20-95 wt %, preferably 30-80 wt %, more preferably 35-70 wt %, of a functional acrylate monomer having at least one functionality, (b) 0.1-20 wt %, preferably 1-18 wt %, more preferably 2-15 wt % of a solvent having a boiling point of at least 150° C., preferably at least 175° C., more preferably at least 200° C. at STP, (c) up to 20 wt %, preferably 0.1-18 wt %, more preferably 1-15 wt % of an acrylic resin, and (d) up to 15 wt %, preferably 0.5-12 wt % more preferably 1-10 wt % of an oligomer including at least one of a polyester residue and a urethane residue.

Another embodiment of the invention is a medium such as in the preceding paragraph, wherein the acrylic resin is present in an amount of 0.1-20 wt % of the medium, and wherein the acrylic resin has a general formula selected from the group consisting of (a) $R^1$ C(O)OR, (b) $Ar^1$ C(O)OR, (c) $Ar^1$ $R^1$ C(O)OR, (d) $R^1$ $Ar^1$ C(O)OR, and combinations thereof, wherein $Ar^1$ is an aromatic residue having up to 30 carbons, that is optionally substituted with at least one substituent selected from the group consisting of —OH, $C_1$-$C_4$-alkoxy, $C_1$-$C_4$-alkoxycarbonyl or carbonyl, wherein $R^1$ is an aliphatic residue having up to 15 carbons, that is optionally substituted with at least one substituent selected from the group consisting of —OH, $C_1$-$C_4$-alkoxy, $C_1$-$C_4$-alkoxycarbonyl or carbonyl, and wherein either or both of $Ar^1$ or $R^1$ may be $C_5$-$C_{10}$-cycloalkyl which is optionally mono- or polysubstituted by $C_1$-$C_4$-alkyl, —OH, $C_1$-$C_4$-alkoxy, $C_1$-$C_4$-alkoxycarbonyl or carbonyl, and combinations thereof.

Yet another embodiment of the invention is a method of forming a decorated glass structure comprising: (a) applying to a first glass substrate an enamel paste composition comprising: (i) a glass component, and (ii) a low VOC, heat-curable medium comprising: (1) 20-95 wt % of a functional acrylate monomer having at least one functionality, (2) 0.1-20 wt % of a solvent having a boiling point above 200° C. at STP, (3) up to 20 wt % of an acrylic resin, and (4) up to 15 wt % of an oligomer including at least one of a polyester residue and a urethane residue, (b) curing the medium by exposure to heat, heating the medium to a maximum of 204° C., thereby firmly adhering the medium to the first substrate, (c) stacking a second glass substrate with the first glass substrate wherein the cured paste-medium lies between the first and second glass substrates, and (d) subjecting the stacked glass substrates to a firing operation upon completion of which, (i) only the first glass substrate bears a sintered enamel composition, (ii) the medium burns out substantially completely, and (iii) the glass substrates do not stick to one another.

Yet another embodiment of the invention is a method of making a solar cell contact comprising: (a) applying a paste to a silicon wafer, wherein the paste comprises (i) a metal component including at least one of silver and aluminum, (ii) a glass component including at least one glass frit, and (iii) a low VOC, heat-curable medium comprising: (1) 20-95 wt % of a functional acrylate monomer having at least one functionality, (2) 0.1-20 wt % of a solvent having a boiling point above 200° C. at STP, (3) up to 20 wt % of an acrylic resin, and (4) up to 15 wt % of an oligomer including at least one of a polyester residue and a urethane residue, and (b) firing the paste to form the contact.

An embodiment of the invention is a method of forming a decorated glass structure comprising: (a) applying to a first glass substrate an enamel composition comprising, prior to firing: (i) a glass component and (ii) an acrylate based medium, (b) curing the medium, (c) stacking a second glass substrate with the first glass substrate wherein the glass component and medium lie between the first and second glass substrates, and (d) firing the glass substrates wherein (i) the glass component fuses to the first glass substrate, (ii) the medium completely burns out, and (iii) the glass substrates do not stick to one another.

The mediums of the invention release less than 250 grams per liter of volatile organic compounds (VOCs), preferably less than 200 g/l, more preferably less than 150 g/l, more preferably still less than 140 g/l, more preferably less than 125 g/l. In the presently most preferred embodiment, the VOC level is no greater than 120 g/l.

The phrase "up to" is intended to mean that the indicated ingredient may or may not be present. The phrase "does not exceed" means that the ingredient in question is positively present in a measurable quantity, up to the recited maximum. In the absence of other guidance, the lower boundary of a range signified by "does not exceed" is 0.01%.

The invention includes an organic medium useful in printing and rollcoating on substrates including glass. The medium includes a functional acrylate monomer, an optional acrylic resin, and an optional oligomer containing acrylate monomers. Details on each constituent follow.

Acrylates. Monofunctional acrylates useful herein include those in a molecular weight range of about 150 to about 400. Generally, monofunctional acrylates including at least one of a $C_1$-$C_{20}$ aliphatic group and a $C_6$-$C_{30}$ aromatic group, are suitable. Specific examples include for example, 2(2-ethoxyethoxy) ethyl acrylate (188); 2-phenoxyethyl acrylate (192); isodecyl acrylate (212); lauryl acrylate (254); and stearyl acrylate (324); where the numbers in parenthesis indicate the approximate molecular weight of a particular acrylate. Alkoxylated aliphatic acrylates with molecular weight range of 150 to 400 are generally useful.

Difunctional acrylates useful herein include those in a molecular weight range of about 250 to about 500. Generally, difunctional acrylates including at least one of a $C_2$-$C_{22}$ aliphatic group and a $C_6$-$C_{30}$ aromatic group are suitable. Specific examples include for example, dipropylene glycol diacrylate (242); triethylene glycol diacrylate (258); tripropylene glycol diacrylate (300); propoxylated neopentyl glycol diacrylate (328); and alkoxylated aliphatic diacrylate (330).

Generally, trifunctional acrylates useful herein include those in a molecular weight range of about 400 to about 1200. Trifunctional acrylates including at least one of a $C_2$-$C_{24}$ aliphatic group and a $C_6$-$C_{36}$ aromatic group are suitable. For example, pentaerythritol triacrylate (298); ethoxylated$_3$ trimethylolpropane triacrylate (428); ethoxylated$_{20}$ trimethylolpropane triacrylate (i.e., icosa-ethoxy trimethylol propane) (1176); and propoxylated$_3$ trimethylolpropane triacrylate (470).

Useful oligomers herein include those in a molecular weight range of about 600-1800. Such oligomers include, for example, generic examples acrylated polyester-urethane copolymer (800 to 1,800); acrylated urethane (600-1200); and acrylated polyester (600-1200).

For example, a useful acrylated polyester/urethane copolymer is that sold by Lord Corporation of Erie, Pa., under the product name PE 5271-20, having a molecular weight of 1,200 to 1,500. Others include ZL-1178 from Thiokol, and CN984 urethane acrylate from Sartomer Corporation.

Resins. Useful resins include polymethyl methacrylate and polyethyl methacrylate, Elvacite™ 2043, Elvacite™ 2045, Paraloid™ B-67, Paraloid™ B-72, and polyisobutyl methacrylate having molecular weights in the range of 30,000 to 150,000. Elvacite™ 2043 is a polyethylmethacrylate resin. The resins are not involved in the crosslinking reaction, but act as a matrix in which the reactive components are distributed. Other non-reactive acrylic resins can be used in place of the Elvacite products.

Curing Agents. Curing agents are optional, but can help to increase curing rates. Free radical initiators such as peroxides may be used, for example hydrogen peroxide, sodium peroxide, potassium peroxide, p-anisoyl peroxide, benzoyl peroxide, dibenzoyl peroxide; t-butyl hydroperoxide, t-amyl hydroperoxide, 2,4,-dicumyl α,α'di(t-butylperoxy)-diisopropyl benzene; 2,5-dimethyl, 2,5-di-(t-butylperoxy) hexane; 2,5-dimethyl, 2,5-di-(t-butylperoxy) hexyne; n-butyl, 4,4-di-(t-butylperoxy)valerate; 1,1-bis-(t-butylperoxy)-3,3,5-trimethyl-cyclohexane; t-butyl perbenzoate, methyl-ethyl ketone peroxide, lauroyl peroxide, and combinations thereof. Specific commercials include Varox® from RT Vanderbilt Co. Inc, Norwalk, Conn.

When they are used, the curing agents are used typically at a level of 0.1-5 wt %, preferably 0.5-4 wt % and more preferably 1% to 3% by weight, based on the weight of total monomer.

Other free radical initiators, that is, reducing agents, such as ammonium and/or alkali metal persulfates, sodium perborate, perphosphoric acid and salts thereof, potassium permanganate, and ammonium or alkali metal salts of peroxydisulfuric acid, can be used. Redox systems using the same initiators coupled with a suitable reductant such as, for example, sodium sulfoxylate formaldehyde, ascorbic acid, isoascorbic acid, alkali metal and ammonium salts of sulfur-containing acids, such as the sulfite, bisulfite, thiosulfate, hydrosulfite, sulfide, hydrosulfide or dithionite of sodium or other alkali metal or alkaline earth metal, formamidinesulfinic acid, hydroxymethanesulfonic acid, acetone bisulfite; amines such as ethanolamine, glycolic acid, glyoxylic acid hydrate, lactic acid, glyceric acid, malic acid, tartaric acid and salts of the preceding acids may be used. Additionally, any salt or other compound providing $Fe^{+2}$, ions, $S_2O_3^{-2}$ ions, or $HSO_3^-$ ions is suitable.

Catalysts. Metal driers act as catalysts for the peroxide curing agents. Metal driers generally include redox reaction catalyzing metal salts (typically carboxylic acid salts) of iron, copper, manganese, silver, platinum, vanadium, nickel, chromium, palladium, or cobalt.

Specific metal driers are metal oxides or organometallic compounds of metals such as, for example, the acetate, formate, oxalate, citrate, acetylacetonate, 2-ethylhexanoate of the aforementioned metals. Specific examples include cobalt napthanate, cobalt linolenate, cobalt acetate, iron acetate, manganese linolenate, and zinc oxalate. The methods of crosslinking herein do not involve, and the curable mediums herein are not made with, photoinitiators. Preferred embodiments of the invention do not include intentionally added photoinitiators, and more preferably, wholly exclude photoinitiators, both in the methods of curing, and in making the mediums covered in the claims.

Solvents. High boiling solvents can be used, i.e., those that do not produce volatile organic chemicals upon drying, curing, or burnout (upon firing). Suitable solvents include 2,2,4-trimethyl pentanediol monoisobutyrate (Texanol™); Methyl Ether of C9 to C11 ethoxylated alcohol, Higlyme™; tetraglyme, soy methyl ester, butoxy triglycol, tripropylene glycol n-butyl ether, solusol 2075, certain VOC exempt solvents such as propylene carbonate and dimethyl carbonate, vegetable oils, mineral oils, low molecular weight petroleum fractions, tridecyl alcohols, and synthetic or natural resins and blends thereof. Surfactants and/or other film forming modifiers can also be included. Solvents having a minimum boiling point of 200° C. are generally suitable herein.

Heat or photo-initiators or both can be applied to an acrylate curable system along with a free-radical initiator. Prior art UV curing exposes the prior art UV-curable system to UV radiation for less than 2 seconds. Prior art UV curable systems involve a UV curable medium together with enamel powder, while prior art solvent based systems involve resins and enamel powder.

Dispersing Surfactant. A dispersing surfactant assists in pigment wetting, when an insoluble particulate inorganic pigment is used. A dispersing surfactant typically contains a block copolymer with pigment affinic groups. For example, surfactants sold under the Disperbyk® and Byk® trademarks by Byk Chemie of Wesel, Germany, such as Disperbyk® 162 and 163, which are solutions of high molecular weight block copolymers with pigment affinic groups, and a blend of solvents (xylene, butylacetate and methoxypropylacetate). Disperbyk® 162 has these solvents in a 3/1/1 ratio, while the ratio in Disperbyk® 163 is 4/2/5. Disperbyk® 140 is a solution of alkyl-ammonium salt of an acidic polymer in a methoxypropylacetate solvent.

Rheological Modifier. A rheological modifier is used to adjust the viscosity of the medium. A variety of rheological modifiers may be used, including those sold under the Byk®, Disperplast®, and Viscobyk® trademarks, available from Byk Chemie. They include, for example, the BYK™ 400 series, such as BYK 411 and BYK 420, (modified urea solutions); the BYK W-900 series, (pigment wetting and dispersing additives); the Disperplast® series, (pigment wetting and dispersing additives for plastisols and organosols); and the Viscobyk® series, (viscosity depressants for plastisols and organosols).

A flow aid is type of rheological modifier, which affects the flow properties of liquid systems in a controlled and predictable way. Rheology modifiers are generally considered as being either pseudoplastic or thixotropic in nature. Suitable rheological modifiers useful herein include those sold commercially under the Additol®, Multiflow®, and Modaflow® trademarks by UCB Surface Specialties of Smyrna, Ga. For example, Additol VXW 6388, Additol VXW 6360, Additol VXL 4930, Additol XL 425, Additol XW 395, Modaflow AQ 3000, Modaflow AQ 3025, Modaflow Resin, and Multiflow Resin.

Adhesion promoter. Adhesion promoting additives are used to improve the compatibility between organic and inorganic components. Suitable adhesion promoters include those sold by GE Silicones of Wilton, Conn. under the Silquest®, CoatOSil®, NXT®, XL-Pearl™ and Silcat® trademarks. Examples include the following product numbers, sold under the Silquest® trademark: A1101, A1102, A1126, A1128, A1130, A1230, A1310, A162, A174, A178, A187, A2120. For example, Silquest® A-187 is (3-glycidoxypropyl)trimethoxysilane, which is an epoxysilane adhesion promoter. Silanes sold by Degussa AG of Düsseldorf, Germany, under the Dynasylan® trademark are also suitable.

Stabilizers. Light or UV stabilizers are classified according to their mode of action: UV blockers—that act by shielding the polymer from ultraviolet light; or hindered amine light stabilizers (HALS)—that act by scavenging the radical intermediates formed in the photo-oxidation process. The compositions of the invention may, when advantageous, comprise about 0.1 to about 2 wt % of a light stabilizer, preferably about 0.5 to about 1.5%, and further comprise about 0.1 to about 4 wt % of a UV blocker, preferably about 1 to about 3%.

Light stabilizers and UV blockers sold under the Irgafos®, Irganox®, Irgastab®, Uvitex®, and Tinuvin® trademarks by from Ciba Specialty Chemicals, Tarrytown, N.Y., may be used, including product numbers 292 HP, 384-2, 400, 405, 411L, 5050, 5055, 5060, 5011, all using the Tinuvin trademark. Suitable UV blocking agents include Norbloc® 7966 (2-(2' hydroxy-5' methacryloxyethylphenyl)-2H-benzotriazole); Tinuvin 123 (bis-(2,2,6,6-tetramethyl-1-(octyloxy)-4-piperidinyl) ester); Tinuvin 99 (3-(2H-benzotriazole-2-yl) 5-(1,1-dimethyl ethyl)-4-hydroxybenzenepropanoic acid, C7-9-branched alkyl esters) Tinuvin 171 (2-(2H-benzotriazol-2-yl)-6-dodecyl-4-methyl-phenol). Products sold under the Norbioc® trademark are available from Janssen Pharmaceutica of Beerse, Belgium.

Suitable hindered amine light stabilizers (HALS) are sold by the Clariant Corporation, Charlotte, N.C., under the Hostavin® trademark, including Hostavin 845, Hostavin N20, Hostavin N24, Hostavin N30, Hostavin N391, Hostavin PR31, Hostavin ARO8, and Hostavin PR25. HALS are extremely efficient stabilizers against light-induced degradation of most polymers. They do not absorb UV radiation, but act to inhibit degradation of the polymer, thus extending its durability. Significant levels of stabilization are achieved at relatively low concentrations. The high efficiency and longevity of HALS are due to a cyclic process wherein the HALS are regenerated rather than consumed during the stabilization process. They also protect polymers from thermal degradation and can be used as the thermal stabilizers The acrylate based curable systems of the invention are cured with convection heating or infrared radiation for 60 seconds or longer. Optional use of curing agents can increase cure rates. The use of moderate heat with free-radical curing allows the cure of much thicker coatings, as much as 150 microns, wet thickness. Ultraviolet curable systems have a wet thickness limit of about 32 microns, and specialized UV curing equipment is needed, for example a Fusion™ ultraviolet curing system, or mercury vapor arc lamps. A distinction of the present invention is that ultraviolet radiation cannot be used to cure the system at a thickness of greater than about 32 microns.

Properties of the Medium.

The viscosity of the medium is about 40,000 to 150,000 cps at a shear rate of 0.125/second; about 6,000 to 18,000 cps at shear rate of 2.5/second, and about 4,000 to 10,000 at shear rate of 25/second. Medium burn-out is approximately 98.5 to 99.5% with 0.5 to 1.5% carbon ash remaining after firing at 640 to 710° C. The weight loss on curing is generally less than 7%. Film hardness is greater than 300 grams using BYK® Gardner scratch pen. The adhesion to glass is sufficient to pass a traditional Scotch® tape test.

Each numerical range disclosed herein that is bounded by zero, has, as an alternative embodiment, a lower bound of 0.1% instead of zero. The term "comprising" provides support for "consisting essentially of" and "consisting of." It is envisioned that an individual numerical value for a parameter, temperature, weight, percentage, etc., disclosed herein in any form, such as presented in a table, provides support for the use of such value as the endpoint of a range. A range may be bounded by two such values.

EXAMPLES

The following compositions represent exemplary embodiments of the invention. They are presented to explain the invention in more detail, and do not limit the invention.

TABLE 1

Working Examples of Acrylate Based Mediums.

| Component/(wt %) | Example No. | | | |
|---|---|---|---|---|
| | 1 | 2 | 3 | 4 |
| SR306 | 32.8 | 0.0 | 20.0 | 32.8 |
| Elvacite 2043 (80% in SR306) | 40.0 | 40.8 | 40.0 | 40.0 |
| 6X037 acrylated Polyester/Urethane co-polymer | 10.0 | 17.0 | 16.6 | 10.0 |
| Elvacite 2043 (80% in Texanol) | 5.0 | 2.0 | 5.0 | 5.0 |
| Tetrafunctional polyester | 4.0 | 1.0 | 0 | 0 |
| SR339 | 4.0 | 4.0 | 2.0 | 4.0 |
| SR 9209 A | 0 | 20.0 | 0 | 0 |
| SR454 | 0 | 15.0 | 12.0 | 0 |
| Craynor CN-111 | 4.0 | 4.0 | 2.0 | 4.0 |
| Modaflow ® AQ3000 flow agent | 0.2 | 0.2 | 0.3 | 0.2 |
| Peroxide curing agent | 2.0 | 2.0 | 2.0 | 2.0 |
| Metal drier | 0 | 0 | 0.1 | 0 |

TABLE 2

Further Working Examples of Acrylate Based Mediums

| Composition in wt % | Heat and photo cure | Heat cure |
|---|---|---|
| SR415 | 37.8 | 38.4 |
| Tetraglyme or higlyme | 37.8 | 38.4 |
| SR306 | 15.1 | 15.4 |
| Elvacite 2043 | 3.8 | 3.8 |
| Dibenzoyl peroxide | 1.7 | 0 |
| Disperbyk 111 | 2.4 | 2.2 |
| BYK 356 | 0.9 | 1.0 |
| Isostearic acid | 0.5 | 0.7 |

SR306 is triproplylene glycol diacrylate; SR 339 is 2-phenoxyethyl acrylate; SR 9209A is alkoxylated diacrylate; SR 454 is ethoxylated trimethylol propane triacrylate; SR 415 is Ethoxylated (20) Trimethylolpropane Triacrylate. The SR-named constituents are available from Sartomer Europe, Paris, France. Craynor CN-111 is epoxidized soybean oil acrylate, available from Cray Valley, Paris, France.

A distinct advantage of the medium of the invention is its low level of volatile organic compounds (VOCs) released during heating and curing. Prior art VOC levels at a 125 micron wet film thickness (solvent-based mediums dried using IR or convection heating), such as 70% diproylene glycol, 20% glycol ether DB (diethylene glycol, monobutyl ether), 6% Klucel™ E resin, and 4% Aerosol™ OT surfactant will release 450 to 500 g/liter when dried at 175 to 185° C. for 3 minutes. The formulations of the invention described herein, when applied at 125 microns wet thickness, release only 114 to 120 g/liter of VOCs. Formulations with the examples given in Table 2 resulted in 85 g and 66 g per liter respectively.

Other prior art formulas containing higher amounts of solvent and lower amounts of resin include, for example: 75% glycol ether DB, 22% propylene glycol, 2% Klucel E™ resin, 1% Aerosol™ OT surfactant. Such a formulation will release 500 to 550 g/liter of VOCs.

The invention allows for screen printing applications (20 to 40 microns thick) as well as roll coat applications (120 to 175 microns thick) onto glass and/or ceramic substrates while minimizing the release of volatile organic compounds during application and use of coating products.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

What is claimed is:

1. A method of forming a coating on a glass, metal, or ceramic substrate comprising:
   (a) applying to a substrate to a thickness of at least 50 microns a low VOC, heat-curable medium comprising:
      (i) 20-95 wt % of heat curable mono-functional acrylate monomers, di-functional acrylate monomers and tri-functional acrylate monomers selected from the group consisting of
         a. monofunctional acrylate monomers selected from the group consisting of 2(2-ethoxyethoxy) ethyl acrylate; 2-phenoxyethyl acrylate; isodecyl acrylate; lauryl acrylate; and stearyl acrylate;
         b. difunctional acrylate monomers including at least one of a $C_2$-$C_{22}$ aliphatic group and a $C_6$-$C_{30}$ aromatic group, and
         c. trifunctional acrylate monomers including at least one of a $C_2$-$C_{24}$ aliphatic group and a $C_6$-$C_{36}$ aromatic group
      with the proviso that the heat-curable medium includes at least one monofunctional acrylate monomer;
      (ii) 0.1-20 wt % of a solvent having a boiling point above 150° C. at STP,
      (iii) 0.1-20 wt % of an acrylic resin, and
      (iv) 0.1-18 wt % of an oligomer including a polyester residue and a urethane residue wherein the medium has a viscosity of 40,000 to 150,000 cps when measured at a shear rate of 0.125/second, and
   (b) curing the medium to form a cross linked network.

2. The method of claim 1, wherein curing the medium comprises heating the medium to a temperature not exceeding 204° C.

3. The method of claim 1, wherein curing the medium comprises contacting the medium with a metal drier.

4. The method of claim 3, wherein the metal drier comprises an organometallic compound including a metal selected from the group consisting of iron, copper, manganese, silver, platinum, vanadium, nickel, chromium, palladium, or cobalt, and combinations thereof.

5. The method of claim 1 wherein the oligomer is present in an amount of 0.1-15 wt % of the medium, and wherein the oligomer has a molecular weight of 600 to 1800.

6. The medium of claim 1, wherein the oligomer is selected from the group consisting of acrylated polyester-urethane copolymers; polyester-urethane copolymers; and combinations thereof.

7. The method of claim 1, wherein the curing agent includes a peroxide selected from the group consisting of hydrogen peroxide, sodium peroxide, potassium peroxide, p-anisoyl peroxide, benzoyl peroxide, dibenzoyl peroxide; t-butyl hydroperoxide, t-amyl hydroperoxide, 2,4,-dicumyl α,α' di(t-butylperoxy)-diisopropyl benzene; 2,5-dimethyl, 2,5-di-(t-butylperoxy) hexane; 2,5-dimethyl, 2,5-di-(t-butylperoxy) hexyne; n-butyl, 4,4-di-(t-butylperoxy)valerate; 1,1-bis-(t-butylperoxy)-3,3,5-trimethyl-cyclohexane; t-butyl perbenzoate, methyl-ethyl ketone peroxide, lauroyl peroxide, and combinations thereof.

8. The method of claim 1, wherein the medium is devoid of photoinitiators.

9. The method of claim 1, wherein the medium releases no greater than 140 grams of volatile organic compounds per liter of the medium.

10. The method of claim 1, wherein the difunctional acrylate monomers are selected from the group consisting of dipropylene glycol diacrylate; triethylene glycol diacrylate; tripropylene glycol diacrylate; propoxylated neopentyl glycol diacrylate; alkoxylated aliphatic diacrylate and combinations thereof.

11. The method of claim 1, wherein the trifunctional acrylate monomers are selected from the group consisting of pentaerythritol triacrylate; ethoxylated$_3$ trimethylolpropane triacrylate; ethoxylated$_{20}$ trimethylolpropane triacrylate; propoxylated$_3$ trimethylolpropane triacrylate, and combinations thereof.

12. The method of claim 10, wherein the trifunctional acrylate monomers are selected from the group consisting of pentaerythritol triacrylate; ethoxylated$_3$ trimethylolpropane triacrylate; ethoxylated$_{20}$ trimethylolpropane triacrylate; propoxylated$_3$ trimethylolpropane triacrylate, and combinations thereof.

13. The method of claim 10, wherein the oligomer is present in an amount of 0.1-15 wt % of the medium, and wherein the oligomer has a molecular weight of 600 to 1800.

14. The method of claim 10, wherein the oligomer is an acrylated polyester-urethane copolymer.

15. The method of claim 10, wherein the curing agent includes a peroxide selected from the group consisting of hydrogen peroxide, sodium peroxide, potassium peroxide, p-anisoyl peroxide, benzoyl peroxide, dibenzoyl peroxide; t-butyl hydroperoxide, t-amyl hydroperoxide, 2,4,-dicumyl α,α' di(t-butylperoxy)-diisopropyl benzene; 2,5-dimethyl, 2,5-di-(t-butylperoxy) hexane; 2,5-dimethyl, 2,5-di-(t-butylperoxy) hexyne; n-butyl, 4,4-di-(t-butylperoxy)valerate; 1,1-bis-(t-butylperoxy)-3,3,5-trimethyl-cyclohexane; t-butyl perbenzoate, methyl-ethyl ketone peroxide, lauroyl peroxide, and combinations thereof.

* * * * *